(12) United States Patent
Lee et al.

(10) Patent No.: US 6,571,448 B2
(45) Date of Patent: Jun. 3, 2003

(54) APPARATUS FOR ATTACHING SAND PAPERS ON DUMMY WAFERS

(75) Inventors: Ho-Yeol Lee, Kyunggi-do (KR); Sang-Do Lee, Kyunggi-do (KR); In-Seok Hwang, Kyunggi-do (KR); Joon-Su Ji, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/927,339

(22) Filed: Aug. 13, 2001

(65) Prior Publication Data

US 2002/0144387 A1 Oct. 10, 2002

(30) Foreign Application Priority Data

Apr. 10, 2001 (KR) .............................................. 01-18968

(51) Int. Cl.[7] ................................................. B23P 19/04
(52) U.S. Cl. ..................... 29/267; 269/289 R; 29/281.1
(58) Field of Search ........................... 269/267, 6, 251, 269/903, 289 R, 289 MR, 302.1, 290, 308; 29/267, 281.1, 251, 252

(56) References Cited

U.S. PATENT DOCUMENTS

| | | | | | |
|---|---|---|---|---|---|
| 1,099,822 | A | * | 6/1914 | Sager | 269/302.1 |
| 4,660,282 | A | * | 4/1987 | Pfaff | 29/829 |
| 5,337,875 | A | * | 8/1994 | Lee | 269/289 MR |
| 5,401,354 | A | * | 3/1995 | Collucci | 269/6 |
| 5,494,553 | A | * | 2/1996 | Colucci | 269/6 |
| 5,816,568 | A | * | 10/1998 | Fox | 269/71 |
| 6,131,261 | A | * | 10/2000 | Michlin | 29/251 |

* cited by examiner

*Primary Examiner*—Lee Wilson
(74) *Attorney, Agent, or Firm*—Lee & Sterba, P.C.

(57) ABSTRACT

An apparatus for attaching an object semi-automatically onto a dummy wafer comprising a stage having a loading surface on which the dummy wafer rests, a pressing device for attaching the object gradually onto the dummy wafer placed on the loading surface, and a supporting device for placing the object in a position spaced apart from the loading surface.

15 Claims, 4 Drawing Sheets

APPARATUS FOR ATTACHING SAND PAPERS ON DUMMY WAFERS

BACKGROUND OF THE INVENTION

1. Field of the Invention

The present invention relates to an apparatus for attaching sand papers semi-automatically onto dummy wafers.

2. Description of Related Art

A probe card is one of the components that form an apparatus for the probe measurement employed in the course of manufacturing semiconductor devices such as transistors and integrated circuits. As shown in FIG. 6, the probing card 20 has a plurality of probes or tips 22 arranged so as to correspond to, and come into electrical contact with, a plurality of electrode pads of semiconductor devices fabricated on a semiconductor wafer, as the electrical characteristics of the semiconductor devices are tested. Because the contact between the electrode pads and the probes is a point contact having a small contact area, the ends of the probes 22 are rounded. Also, the ends of the probes 22 need to be polished in order to prevent them from oxidizing upon contact with air. The polishing is accomplished via a dummy wafer W on which a sand paper 10 is attached.

However, up until now, an operation to prepare the dummy wafer W for polishing, i.e., attaching the sand paper 10 to the dummy wafer W, has been manually carried out. Attaching the sand paper 10 manually to the dummy wafer W may present the following problems. First, after being attached to a dummy wafer, a surface of the sand paper is usually rubbed with a matter such as pieces of paper to enhance the degree of adhesion. As a result of this rubbing, contaminants or foreign substances can be accumulated on the surface of the sand paper deteriorating its function. Secondly, during the attaching, air bubbles can form between the sand paper and the dummy wafer. These air bubbles may impose an impact on the tips of the probes to induce a defect therein during polishing. Thirdly, the sand paper should optimally be attached onto the center of the dummy wafer correctly, as shown in FIG. 6. Attaching the sand paper correctly, however, is not guaranteed when done manually and varies according to the skill or experience of workers. If it is not correctly attached onto the center of the dummy wafer, the resulting dummy wafers will be of inferior quality. Fourthly, it takes significant time to attach the sand paper onto the dummy wafer. For example, it takes a skilled worker one minute to attach one sheet of sand paper. Lastly, since the attaching method can be different according to workers, dummy wafers of inferior quality can thereby be made.

SUMMARY OF THE INVENTION

In order to solve the aforementioned problems, it is a feature of an embodiment of the present invention to provide a new apparatus that can easily attach an object onto a dummy wafer.

This and other features are provided, according to the present invention, by an apparatus for attaching an object semi-automatically onto a dummy wafer comprising a stage having a loading surface on which the dummy wafer rests, a pressing means for attaching the object gradually on the dummy wafer placed on the loading surface, and a support means for placing the object in a position spaced apart from the loading surface.

In a preferred embodiment of the present invention, the supporting means includes at least two supporting rods disposed to cross the loading surface at an angle to said loading surface for placing the object thereon, and side plates disposed on opposite sides of the stage for fixing both ends of the support rods.

The supporting means further includes a plurality of mini-rollers disposed on the support rods to allow the object to be easily slid without adhering to the support rods, and a pair of holders disposed apart from each other on the support rods for guiding both sides of the object so that the object may be slid down correctly. The holders are disposed such that the distance between them is adjustable in order to accommodate objects of differing sizes.

The two support rods of the supporting means may be disposed to be inclined, allowing the object to be placed on a slope thereon.

Also, the stage may have openings or grooves formed at an edge of the loading surface to load or unload the dummy wafer easily. The loading surface may also be disposed lower than an upper surface of the stage.

In an embodiment of the present invention, guide rails disposed at both sides of the stage allow the pressing means and the supporting means to be movable so that they may be slid in a direction that will allow the object to be attached onto the dummy wafer.

In the apparatus of an embodiment of the present invention, the pressing means includes a roller for attaching the object onto the dummy wafer, brackets for fixing both ends of the roller rotatably, and a handle connected with the brackets for moving the roller in the direction that will allow the object to be attached onto the dummy wafer. The roller is formed of material having a given elasticity to prevent the dummy wafer from being damaged and to increase the adhesion degree during the attaching of the object.

BRIEF DESCRIPTION OF THE DRAWINGS

The foregoing and other features and advantages of the present invention will become more apparent by describing in detail preferred embodiments thereof as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Korean Patent Application No. 2001-18968, filed on Apr. 10, 2001, and entitled: "Apparatus for Attaching Sand Papers on Dummy Wafers," is herein incorporated by reference in its entirety.

The present invention will now be described more fully hereinafter with reference to the accompanying drawings, in which preferred embodiments of the present invention are shown. This invention may, however, be embodied in many different forms and should not be construed as being limited to the embodiments set forth herein; rather, these embodiments are provided so that this disclosure will be thorough and complete, and will fully cover the scope of the invention to those skilled in the art. Like numbers refer to like elements throughout.

Figure 1:
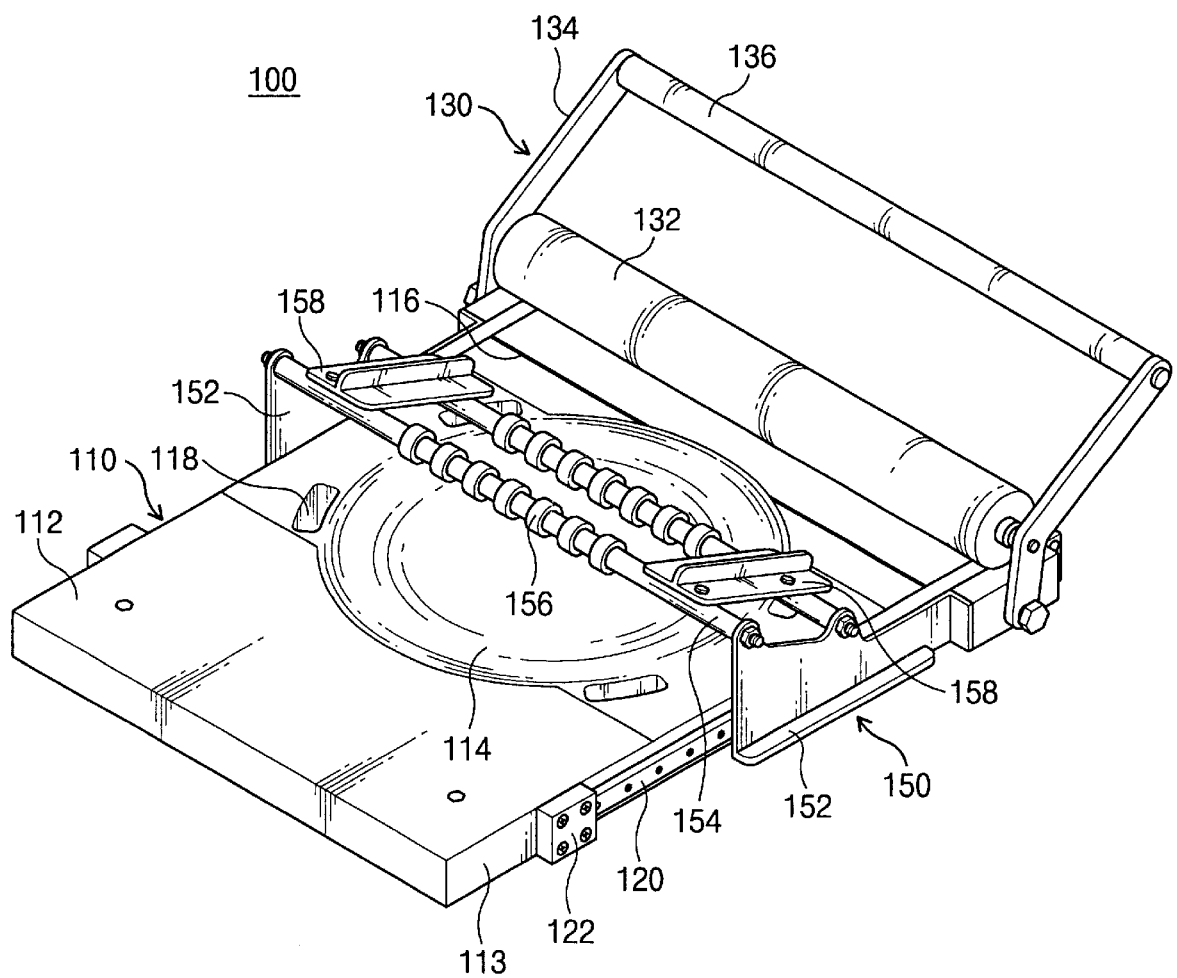
FIG. 1 illustrates a schematic perspective view of an apparatus for attaching a sand paper on a dummy wafer in accordance with a preferred embodiment of the present invention.
Figure 2:
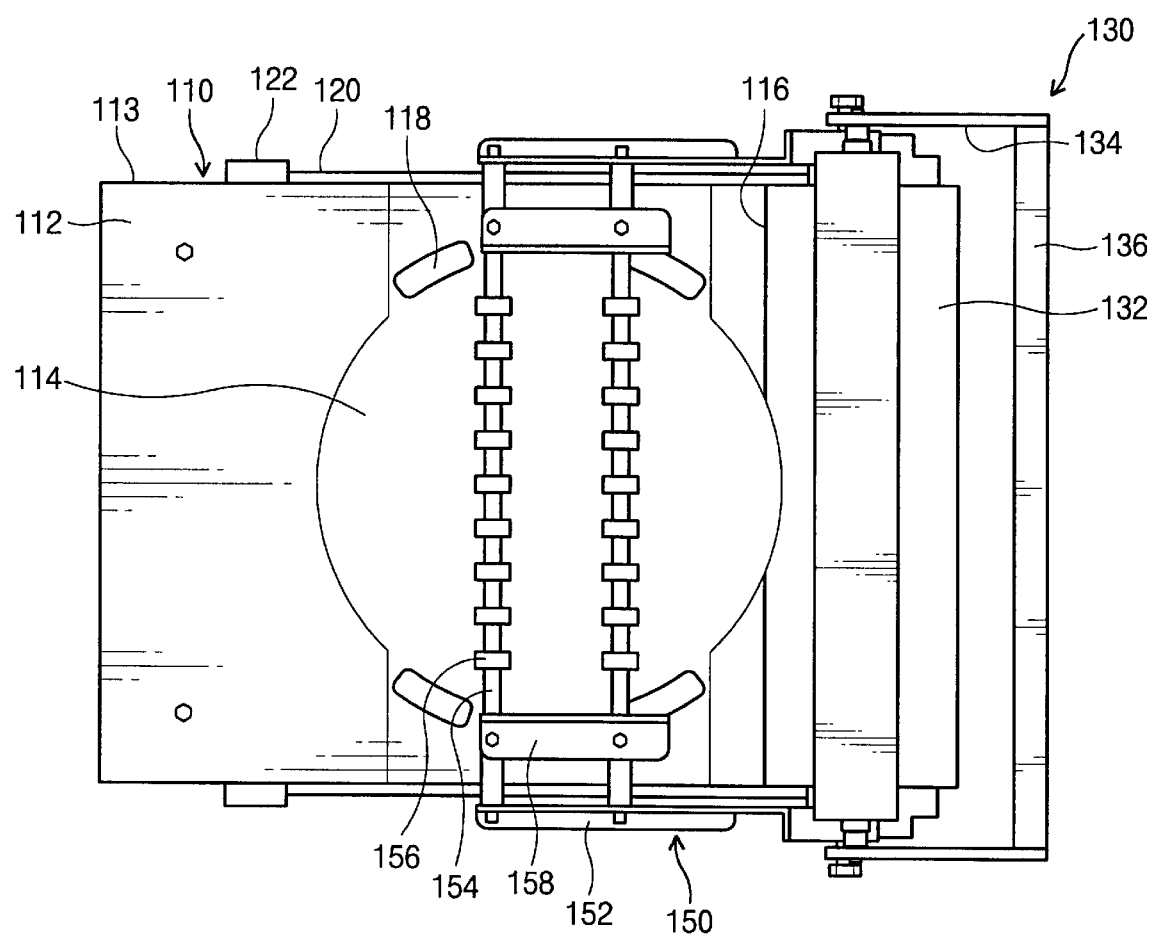
FIG. 2 illustrates a top plan view of the attaching apparatus in accordance with an embodiment of the present invention.
Figure 3:
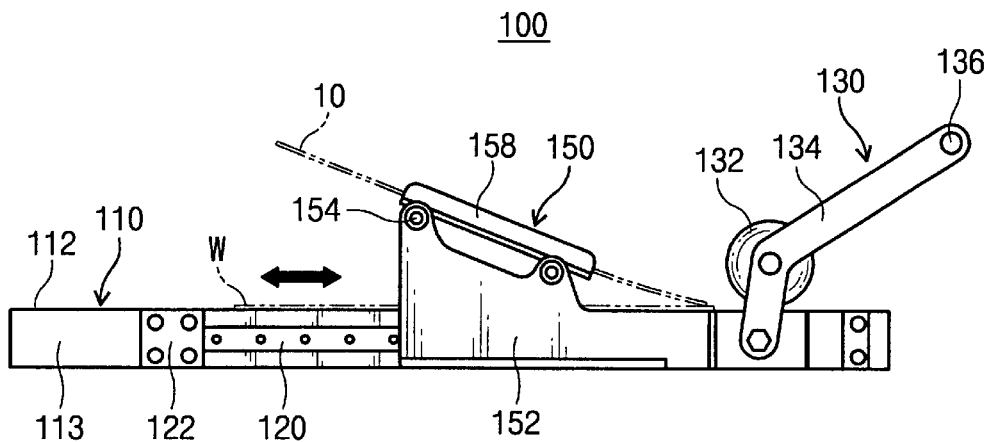
FIG. 3 illustrates a side elevation view of the attaching apparatus in accordance with an embodiment of the present invention.

FIG. 1 illustrates a schematic perspective view of an apparatus 100 for attaching sand papers onto dummy wafers in accordance with a preferred embodiment of the present invention. FIG. 2 and FIG. 3 illustrate top plan and side elevation views, respectively, of the apparatus 100 shown in FIG. 1.

The attaching apparatus 100 in accordance with a preferred embodiment of the present invention comprises a stage 110, a pressing device 130, and a supporting device 150.

Figure 4:
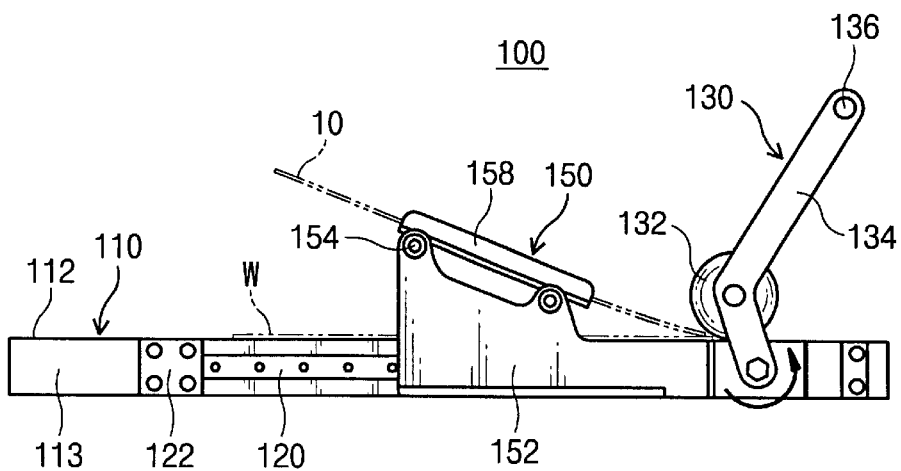
FIG. 4 and FIG. 5 illustrate diagrams showing the operation steps of attaching a sand paper onto a dummy wafer by the attaching apparatus of an embodiment of the present invention.
Figure 5:
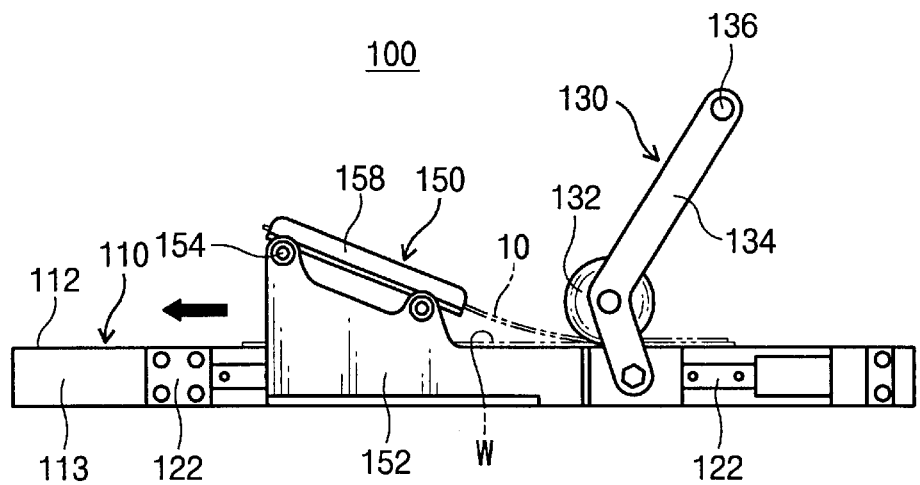
Figure 6:
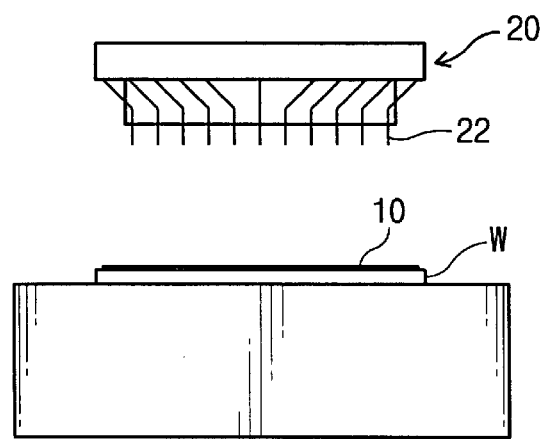
FIG. 6 illustrates a schematic diagram showing the operation of polishing tips of a probe card by means of the dummy wafer.

The stage 110 of the attaching apparatus 100 includes a loading surface 114 formed on an upper surface 112 of the stage 110 to load a dummy wafer W onto which a sand paper 10 is to be attached, as shown in FIG. 3 to FIG. 5. The loading surface 114 is formed lower than the upper surface 112 of the stage 110 by as much as 0.6 mm. Also, on the upper surface 112 of the stage 110, a position standard line 116 for defining a position of a lower end of the sand paper 10 is marked. In the vicinity of an edge of the loading surface 114, four openings or grooves 118 are formed. Owing to the grooves 118, the dummy wafer W can be easily loaded or unloaded onto or from the loading surface 114. On both sides 113 of the stage 110, guide rails 120 are disposed to guide the movement of the supporting device 150 and the pressing device 130.

The supporting device 150 of the attaching apparatus 100 functions to maintain the sand paper 10 to be attached onto the dummy wafer W in a position spaced apart from the loading surface 114 and inclined at a given angle, preferably 60 degrees thereto, as shown in FIG. 3. At this time, the lower end of the sand paper 10 is positioned to be aligned with the position standard line 116.

The supporting device 150 includes two support rods 154, two side plates 152, a plurality of mini-rollers 156, and a pair of holders 158. The side plates 152 are mounted on the guide rails 120 which are positioned on opposite ends of the stage 110. Both ends of the support rods 154 are fixed on the top ends of the side plates 152. The support rods 154 are disposed to cross the loading surface 114 at an angle to said loading surface. The mini-rollers 156 are disposed on the support rods 154 to allow the sand paper 10 to be easily slid there onto, but not to be adhered thereto. The two holders 158 are disposed on the support rod 154 at a distance from each other. The distance between the two holders 158 can be adjusted according to the size of the sand paper 10, e.g., 7 to 12 inches. Preferably, the holders 158 are formed of a "⊦" shape to prevent the sand paper 10 from passing between the support rods 154. Thus, since the two holders 158 guide both sides of the sand paper 10 to be correctly positioned as it is being slid onto the mini-rollers 156, it can be attached onto a correct position on the dummy wafer W.

The pressing device 130 of the attaching apparatus 100 functions to press the sand paper 10 placed on the support rods 154 gradually by means of a roller 132 thereof, thereby attaching the sand paper 10 gradually onto an upper attaching surface of the dummy wafer W.

The pressing device 130 includes a roller 132 having a length wider than the width of the stage 110, brackets 134 on which both ends of the roller 132 are rotatably fixed, and a handle 136 connected to the brackets 134 for moving the roller 132. The brackets 134 are pivotally fixed on rear end portions of the side plates 152 and are to be slid along the guide rails 120 together with the side plates 152 of the supporting device 150. The roller 132 can roll onto the upper attaching surface of the dummy wafer W when the brackets 134 move forward or in the direction of the arrow in FIG. 5 along the guide rails 120. The roller 132 rolls together with the side plates 152. At this time, the handle 136 is slowly pushed by the user to move the brackets 134 and the side plates 152 forward. Thus, the sand paper 10 positioned between the roller 132 and the dummy wafer W is gradually adhered onto the upper attaching surface of the dummy wafer W as the roller 132 is being rolled.

To restrain the movement of the rear end portions of the side plates 152 on which the brackets 134 are pivotally fixed, i.e. the movement of the brackets 134, stoppers 122 can be disposed on the rails 120. Accordingly, the movement of the roller 132 can be restrained within a given range. Also, a locking pin (not shown) for locking the roller 132 can be disposed on the upper surface 112 of the stage 110 to prevent the roller 132 from moving freely from a stand-by position after use.

The roller 132 is formed of material such as silicon or rubber having a given elasticity to prevent the dummy wafer W from being damaged, and to increase the adhesion density or degree when the roller 132 presses the sand paper 10 onto the upper attaching surface of the dummy wafer W.

The operation of the apparatus 100 for attaching sand paper onto dummy wafers in accordance with the present invention will now be explained.

FIG. 4 and FIG. 5 illustrate diagrams showing the operation steps of attaching a sand paper 10 onto a dummy wafer W by the attaching apparatus 100 of the present invention.

Referring to FIG. 4 and FIG. 5, first the dummy wafer W is loaded onto the loading surface 114 of the stage 110. Then the sand paper 10 is placed on two support rods 154. At this time, a lower end of the sand paper 10 is positioned to be aligned with the position standard line 116, and both of its sides are positioned between the pair of holders 158. Next, a user pushes the handle 136 forward or in the direction of the arrow in FIG. 5. As the handle 136 is pushed, the roller 132 is rolled onto an upper attaching surface of the dummy wafer W along brackets 134 which move forward together with side plates 152 along guide rails 120. At this time, the sand paper 10 positioned between the roller 132 and the dummy wafer W is gradually attached or adhered onto the upper attaching surface of the dummy wafer W from the lower end thereof until the movement of rear end portions of the side plates 152 are restrained by stoppers 122. Thus, the sand paper 10 is uniformly attached onto the upper attaching surface of the dummy wafer W.

As is apparent from the foregoing description, it can be appreciated that the attaching apparatus of the present invention can prevent contaminants or foreign substances from accumulating on the surface of the sand paper. Further, the attaching apparatus of the present invention can prevent air bubbles from being generated between the sand paper and the dummy wafer. Also, the attaching apparatus of the present invention can attach the sand paper onto the center of the dummy wafer, reduce the operation time compared with the manual operation time, and obtain a uniform quality regardless of the skill or experience of users.

In the drawings and specification, a preferred embodiment of the present invention has been disclosed and, although specific terms are employed, they are used in a generic and descriptive sense only and not for the purpose of limitation. Accordingly, it will be understood by those of ordinary skill in the art that various changes in form and detail may be made without departing from the spirit and scope of the invention as set forth in the following claims.

What is claimed is:

1. An apparatus for attaching an object onto a dummy wafer comprising:
   a stage having a loading surface on which said dummy wafer rests, said dummy wafer coming into direct contact with said loading surface;
   pressing means for attaching said object gradually onto said dummy wafer placed on said loading surface; and
   supporting means for placing said object on a position spaced apart from said loading surface, wherein said supporting means includes at least two support rods disposed to cross said loading surface at an angle to said loading surface for placing said object thereon and side plates disposed on opposite sides of said stage for fixing both ends of said stage for fixing both ends of said support rods thereto.

2. The apparatus according to claim 1, wherein said supporting means further includes a plurality of mini-rollers disposed on said support rods to allow said object to be slid without adhering to said support rods.

3. The apparatus according to claim 1, wherein said two support rods of said supporting means are disposed to be inclined to allow said object to be placed on a slope thereon.

4. An apparatus for attaching an object onto a dummy wafer comprising:
   a stage having a loading surface on which said dummy wafer rests, said dummy wafer coming into direct contact with said loading surface;
   pressing means for attaching said object gradually onto said dummy wafer placed on said loading surface; and
   supporting means for placing said object on a position spaced apart from said loading surface, wherein said supporting means further includes a pair of holders disposed apart from each other on said support rods for guiding both sides of said object to allow said object to be slid down in a direction and position corresponding to those of said holders.

5. The apparatus according to claim 4, wherein said holders are disposed such that a distance between them is adjustable according to a size of said object.

6. An apparatus for attaching an object onto a dummy wafer comprising:
   a stage having a loading surface on which said dummy wafer rests, said dummy wafer coming into direct contact with said loading surface;
   pressing means for attaching said object gradually onto said dummy wafer placed on said loading surface; and
   supporting means for placing said object on a position spaced apart from said loading surface, wherein said stage has openings or grooves formed at an edge of said loading surface to facilitate loading of said dummy wafer.

7. An apparatus for attaching an object onto a dummy wafer comprising:
   a stage having a loading surface on which said dummy wafer rests, said dummy wafer coming into direct contact with said loading surface, wherein said loading surface is disposed lower than an upper surface of said stage;
   pressing means for attaching said object gradually onto said dummy wafer placed on said loading surface; and
   supporting means for placing said object on a position spaced apart from said loading surface.

8. An apparatus for attaching an object onto a dummy wafer comprising:
   a stage having a loading surface on which said dummy wafer rests, said dummy wafer coming into direct contact with said loading surface;
   pressing means for attaching said object gradually onto said dummy wafer placed on said loading surface; and
   supporting means for placing said object on a position spaced apart from said loading surface,
   wherein said pressing means and said supporting means are movable so that they may be slid in a direction that will allow said object to be attached onto said dummy wafer.

9. The apparatus according to claim 8, wherein said stage has guide rails disposed at both sides thereof for guiding said pressing means and said supporting means to allow them to be movable so that they may be slid in a direction that will allow said object to be attached onto said dummy wafer.

10. An apparatus for attaching an object onto a dummy wafer comprising:
    a stage having a loading surface on which said dummy wafer rests, said dummy wafer coming into direct contact with said loading surface;
    pressing means for attaching said object gradually onto said dummy wafer placed on said loading surface; and
    supporting means for placing said object on a position spaced apart from said loading surface,
    wherein said pressing means includes:
      a roller for attaching said object onto said dummy wafer;
      brackets for rotatably fixing both ends of said roller; and
      a handle connected with said brackets for moving said roller in said direction that will allow said object to be attached onto said dummy wafer.

11. The apparatus according to claim 10, wherein said roller is formed of a material having a given elasticity to prevent said dummy wafer from being damaged and to increase the degree of adhesion during the attaching of said object.

12. The apparatus according to claim 10, wherein said guide rails have at least one stopper disposed thereon for restraining the movement of said roller.

13. The apparatus according to claim 10, wherein said stage has a locking pin for locking said roller to allow said roller to be maintained in a fixed position.

14. An apparatus for attaching an object onto a dummy wafer comprising:
    a stage having a loading surface on which said dummy wafer rests, said dummy wafer coming into direct contact with said loading surface, and further having a position standard line marked thereon for adjusting a position of a lower end of said object;
    pressing means for attaching said object gradually onto said dummy wafer placed on said loading surface; and
    supporting means for placing said object on a position spaced apart from said loading surface.

15. An apparatus for attaching an object onto a dummy wafer comprising:
    a stage having a loading surface on which said dummy wafer rests, said dummy wafer coming into direct contact with said loading surface, and openings or grooves formed at an edge of said loading surface to facilitate unloading of said dummy wafer;
    pressing means for attaching said object gradually onto said dummy wafer placed on said loading surface; and
    supporting means for placing said object on a position spaced apart from said loading surface.

* * * * *